United States Patent [19]
Comeau, II et al.

[11] Patent Number: 5,543,759
[45] Date of Patent: Aug. 6, 1996

[54] AUDIO AMPLIFICATION CIRCUITS

[75] Inventors: Richard J. Comeau, II, Cape Girardeau; Richard Fay, Jackson, both of Mo.

[73] Assignees: Digital Lab Studios, LLC; Horizon Music, Inc., both of Cape Girardeau, Mo.

[21] Appl. No.: 418,366

[22] Filed: Apr. 7, 1995

[51] Int. Cl.$^6$ ................... H03G 3/10; H03F 3/68
[52] U.S. Cl. ............... 330/282; 330/84; 330/148; 330/295; 381/109; 381/121
[58] Field of Search ............. 330/84, 86, 124 R, 330/148, 282, 295; 381/104, 105, 109, 120, 121

[56] References Cited

U.S. PATENT DOCUMENTS 3,414,830  12/1968  Hellwarth ............... 330/124 R X
4,396,890  8/1983   Kato et al. ............... 330/86

OTHER PUBLICATIONS

Clarke, "Playmate 3W+3W Stereo Amplifier", *Electronics Australia*, Jan., 1980 pp. 52–59, vol. 41, No. 10.

*Primary Examiner*—James B. Mullins
*Attorney, Agent, or Firm*—Polster, Lieder, Woodruff & Lucchesi, LC

[57] ABSTRACT

An audio amplification circuit includes a ganged pair of logarithmic potentiometers, each potentiometer of the pair having an input terminal, an output terminal, and a wiper terminal. The input terminals of each potentiometer are adapted for connection to an audio input signal from an audio device such as a microphone. A preamplifier stage having an input is connected to the wiper terminals of both logarithmic potentiometers. An amplification stage has a matched pair of operational amplifiers with each operational amplifier having an input connected to the output of the preamplifier stage. Each operational amplifier has a feedback loop which includes the resistance of at least one of the logarithmic potentiometers between the output terminal and the wiper terminal of said logarithmic potentiometer. The outputs of the matched pair of operational amplifiers constitute the outputs of the amplification stage. The outputs may be daisy-chained together, and a floating output stage is also provided. The circuitry with certain modifications may also be used as an interface between an audio device such as a microphone and a recording device to bring all inputs to the proper level for the recording device.

30 Claims, 3 Drawing Sheets

AUDIO AMPLIFICATION CIRCUITS

BACKGROUND OF THE INVENTION

This invention relates to audio circuits and, more particularly, to audio circuits used for amplification and interface purposes.

Various audio amplifier circuits are available, but they could be improved. For example, such circuits conventionally use transformers to convert the input signals to the desired output levels. Such transformers add undesirable cost and weight to the circuit. In addition, conventional circuits are not particularly well suited for driving multiple parallel outputs. For example, at a press conference a single microphone may be best positioned to receive the speaker's voice, but a multitude of persons may want a feed from that microphone. Conventional circuits are not well suited to provide such multiple feeds without undesirable distortion and loss of signal strength. Moreover, the frequency response of conventional audio amplifier circuits, while adequate, could also be improved.

Problems also arise when currently available transformer based circuits are used with charged microphones. These microphones require a source of current, but that current is typically not available from the transformer circuit because of the inability of such circuits to pass dc power. A separate box must generally be used to solve this problem, with the attendant inconvenience and cost.

Audio amplifier circuits are used with various types of equipment, such as microphones, musical instruments, etc., which have different impedances. It would be desirable to have a single audio amplifier circuit which could readily accommodate such diverse pieces of equipment, but conventional circuits are not well-suited for that task. Prior art equipment typically has a preset input impedance, or at most a choice of two preset input impedances. These impedances remain unchanged during use of the equipment and the resulting impedance mismatches adversely affect the signal characteristics. The prior art equipment provides for variation in gain to somewhat compensate, but even with variation in gain the underlying problem—the impedance mismatch—remains.

In addition, conventional audio circuits are not always well suited to provide the level shifting which is required with modem communications systems. For example, a radio call-in program requires feeding a telephone signal to a radio station console, which operates at a different level. As a result of inadequate conversion of these levels, the telephone caller's voice when broadcast over the air invariably sounds different than the studio voices. In addition, an undesirable hum may arise in these circumstances. Similarly, remote television feeds suffer from some loss of fidelity as well. Such loss of fidelity can arise not only from inadequate level shifting, but also from variations in ground reference, which are practically unavoidable with conventional equipment.

Signal degradation also occurs in existing equipment when the signal is transmitted over a high capacitance cable. Currently available amplification circuits are generally unable to perform acceptably in these circumstances.

Similar problems arise in matching the signal levels of various audio inputs (such as microphones or musical instruments) to the requirements of recording equipment. Due to such differences, a console (which is not inexpensive) is typically required between the various input devices and a recording device such as an Alesis sound recording deck. It would be a great advantage to have a relatively simple, inexpensive interface circuit which would allow any of a number of different audio input devices to be used directly with a single piece of recording equipment.

SUMMARY OF THE INVENTION

Among the various objects and features of the present invention are the provision of an audio amplifier circuit which eliminates the need for a transformer.

Another object is the provision of such a circuit which is entirely solid state in construction while providing superior isolation.

A third object is the provision of such a circuit which has a high current output so as to be capable of driving high current loads and multiple parallel outputs.

A fourth object is the provision of such a circuit which has improved frequency response and current throughput.

A fifth object is the provision of such a circuit which may be readily adjusted by a user to accept various types of inputs, at different signal levels.

A sixth object is the provision of such a circuit which easily provides both the level shifting required between different pieces of equipment and floating outputs if necessary.

A seventh object is the provision of such a circuit which eliminates undesirable hum in audio circuits.

An eighth object is the provision of an audio interface circuit which easily and inexpensively matches the signal levels of various audio inputs to the requirements of a piece of recording equipment.

A ninth object is the provision of such circuits which are relatively simple and inexpensive in construction.

A tenth object is the provision of an audio amplification circuit with the capability to adjust the input impedance over a substantial range to eliminate the problem of impedance mismatch.

An eleventh object is the provision of such a circuit which simultaneously adjusts both input impedance and gain.

A twelfth object is the provision of such a circuit which may satisfactorily drive a high capacitance cable.

A thirteenth object is the provision of such a circuit which includes integral provision for supplying charging current to charged microphones without the necessary of a separate piece of equipment.

Other objects and features will be in part apparent and in part pointed out hereinafter.

Briefly, in a first aspect of the present invention an audio amplification circuit includes a ganged pair of logarithmic potentiometers. Each potentiometer of the pair has an input terminal, an output terminal, and a wiper terminal. The input terminals of each potentiometer are adapted for connection to an audio input signal from an audio device. A preamplifier stage of the circuit has an input connected to the wiper terminals of both logarithmic potentiometers, and also has an output. The circuit also includes an amplification stage having a matched pair of operational amplifiers with each operational amplifier having an input connected to the output of the preamplifier stage. Each operational amplifier has a feedback loop which includes the resistance of at least one of the logarithmic potentiometers between the output terminal and the wiper terminal of the logarithmic potentiometer. The outputs of the matched pair of operational amplifiers constituting the outputs of the amplification stage.

In a second aspect of the present invention, an audio amplification circuit includes a ganged pair of potentiometers, each potentiometer of the pair having an input terminal, an output terminal, and a wiper terminal. The input terminals of each potentiometer are adapted for connection to an audio input signal from an audio device. A preamplifier stage of the circuit has an input connected to the wiper terminals of both potentiometers. An amplification stage having a matched pair of operational amplifiers is also included in the circuit.

In a third aspect of the present invention, the audio amplification circuit also includes a plurality of output sockets connected in parallel to the outputs of the matched operational amplifiers so that the circuits may be daisy chained together.

In a fourth aspect of the present invention, the audio amplification circuit also includes a stage to provide a floating output.

In a fifth aspect of the present invention, an audio interface circuit includes a ganged pair of potentiometers, each potentiometer being adapted for connection to an audio input signal from an audio device. The ganged potentiometers are configured to vary the input impedance of the audio interface circuit and have a control knob which is manually operable to adjust the gain of the audio interface circuit to match the level of the signal from the audio device to a predetermined signal level. A preamplifier stage has an input connected to both potentiometers and an output connected to an amplification stage. The amplification stage has a matched pair of operational amplifiers with each operational amplifier having an input connected to the output of the preamplifier stage. An output stage is connected to both outputs of the amplification stage for providing an output signal at the predetermined level set by the potentiometers to a second audio device such as a recording device.

BRIEF DESCRIPTION OF THE DRAWINGS

Similar reference characters indicate similar parts throughout the several views of the drawings.

DESCRIPTION OF THE PREFERRED EMBODIMENTS

Figure 1:
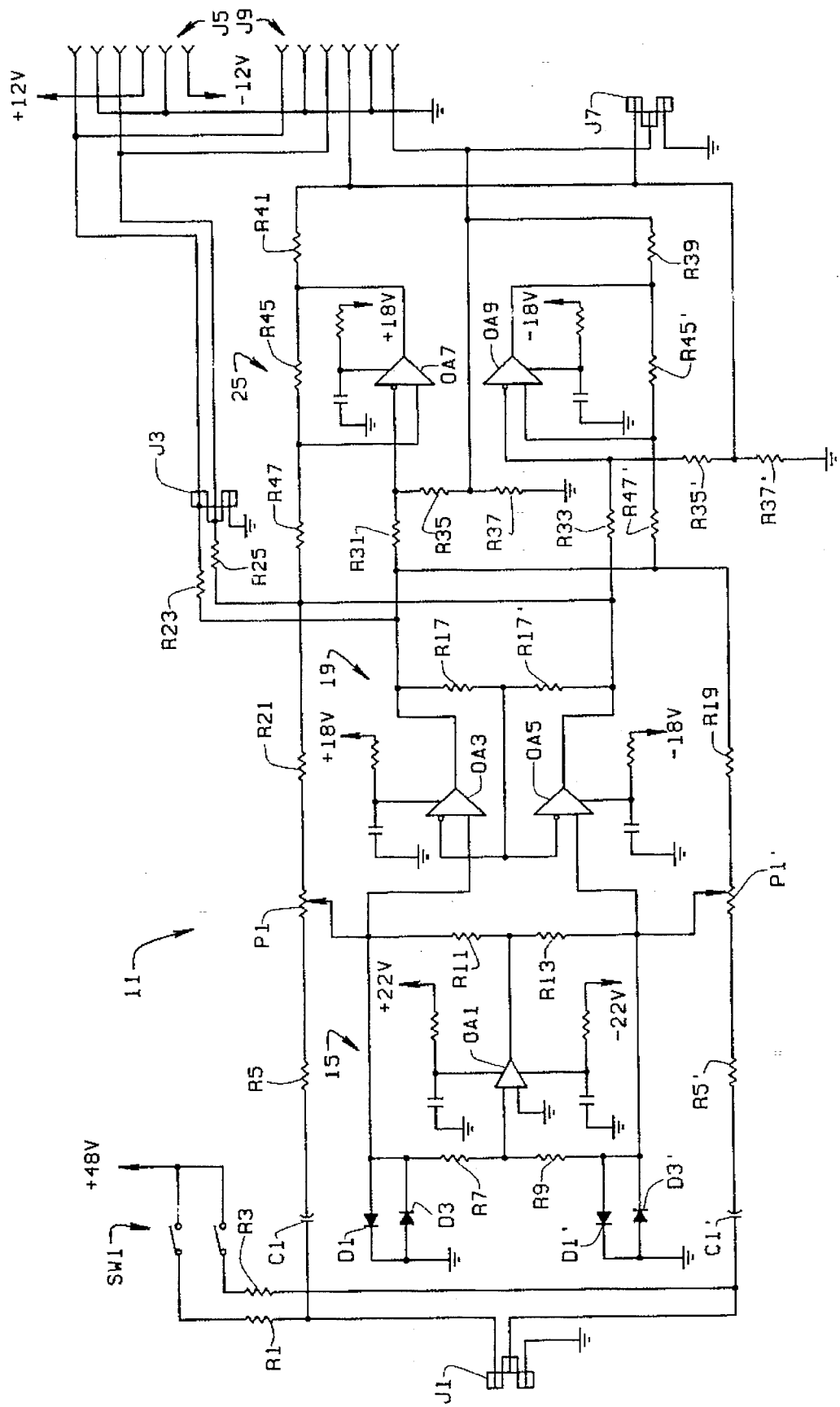
FIG. 1 is an electrical schematic of an audio amplifier circuit of the present invention.

Turning now to the drawings, an audio amplification circuit 11 of the present invention is shown in FIG. 1. Circuit 11 includes a plug J1 suitable for accepting an audio input such as a microphone input or an input from an electronic musical instrument. Circuit 11 is designed so that it may be used with both charged and uncharged microphones. To this end, a set of manually operable, ganged switches SW1 are connected between a voltage source (such as the +48 V source shown) and (through a pair of 6.8K resistors R1, R3) to the two live sides of plug J1. When the user desires to charge the microphone, he or she simply closes switch SW1 to allow current to flow from the source, through the resistors, to the microphone.

It should be apparent from an inspection of FIG. 1 that circuit 11 treats both sides of the input signal from plug J1 symmetrically. For brevity, only the top part of the circuit is usually described. It should be understood that the bottom portion of the circuit has substantially identical components and functions in essentially the same manner.

The audio input signal from plug J1 is supplied through a 100 µF capacitor C1 and a 1K resistor R5 to the input terminal of a logarithmic potentiometer P1. Logarithmic potentiometers P1 and P1' are ganged together and manually operable by a single control knob. The wiper terminal of potentiometer P1 is connected as shown to a preamplifier stage 15 of circuit 11. The particular configuration shown has the capability of changing both the gain and the input impedance of circuit 11 simultaneously.

Preamplifier stage 15 includes a set of diodes D1, D3 (and D1' and D3') for overvoltage protection. It also includes a series circuit made up on two resistors R7, R9, connected respectively to the wiper terminal of the two potentiometers. The junction between resistors R7 and R9 is connected to the inverting input to an operational amplifier (op amp) OA1. Op amp OA1 is preferably a bipolar/JFET audio operational amplifier with low noise, such as the op amp sold under the trade designation OP176GN by Analog Devices of Norwood, Mass. By way of example, this particular op amp has a total harmonic distortion of 0.0006 and a 6 nV noise floor. The output of op amp OA1 is also connected, through a second pair of 5.11K resistors R11 and R13 respectively, to the wiper terminals of the potentiometers.

The two outputs of the preamplifier stage, taken at the top of resistor R11 and the bottom of resistor R13 respectively, are supplied to an amplification stage 19. Specifically, these outputs are connected to the non-inverting inputs of a matched pair of op amps OA3, OA5. Op amps OA3 and OA5 are preferably disposed on a single chip such as the high speed, low power dual operational amplifier sold under the trade designation AD826AN by Analog Devices of Norwood, Mass. The inverting input of each is connected to its respective output through a 10K resistor R17. The output of op amp OA3 is also connected, through a 51.1K resistor R19 to the output terminal of logarithmic potentiometer P1', while the output of op amp OA5 is similarly connected through a 51.1K resistor R21 to the output terminal of logarithmic potentiometer P1. It has been found that this particular configuration provides an essentially linear response in gain versus movement of the ganged potentiometer control knob.

The outputs of op amps OA3 and OA5 provide the output of the amplification stage, which is supplied through a pair of 220 Ω resistors R23, R25 to a plug J3 which is adapted for accepting a suitable connector to another piece of audio equipment (not shown). In addition, these outputs are supplied to a socket J5 (shown in the upper-right corner of FIG. 1) by means of which a multitude of circuits 11 may be daisy-chained together. With this particular configuration, high output currents (on the order of 50 mA) are achievable, which are much higher than available with conventional equipment.

It is preferred that circuit 11 also include a floating output stage 25. To this end, the output of op amp OA3 is supplied through a 10K resistor R31 to the non-inverting input of an op amp OA7. Similarly, the output of op amp OA5 is supplied through a 10K resistor R33 to the non-inverting input of an op amp OA9. Op amps OA7 and OA9 are a matched pair and preferably are disposed on a single chip such as the dual, low power video op amp chip sold under the trade designation AD828AN for Analog Devices of Norwood, Mass.

The non-inverting inputs are also connected through a pair of 10K resistors R35, R37 (and R35', R37') to ground.

The junction between resistors R35, R37 is connected, through a 220 Ω resistor R39, to the output of op amp OA9, while the junction between resistors R35', R37' is connected through a 220 Ω resistor R41 to the output of op amp OA7. It should also be noted that the output of each op amp of the floating output stage is connected to its inverting input through a 10K resistor R45. Resistor R45 is also connected, through a 10K resistor R47 to the output of op amp OA5, while resistor R45' is also connected through a 10K resistor R47' to the output of op amp OA3. This configuration provides unity gain for the output of floating output stage 25.

The output of floating output stage 25 is taken at the other sides of resistors R39 and R45 and supplied to a suitable plug J7 adapted for connection to another piece of equipment (not shown). In addition, these outputs are supplied to a socket J9 which has as inputs not only the floating outputs of stage 25, but also the outputs of stage 19, as shown.

It has been found that the amplification circuit 11 as shown readily and inexpensively accomplishes all the amplification circuit objectives set forth above.

Figure 2:
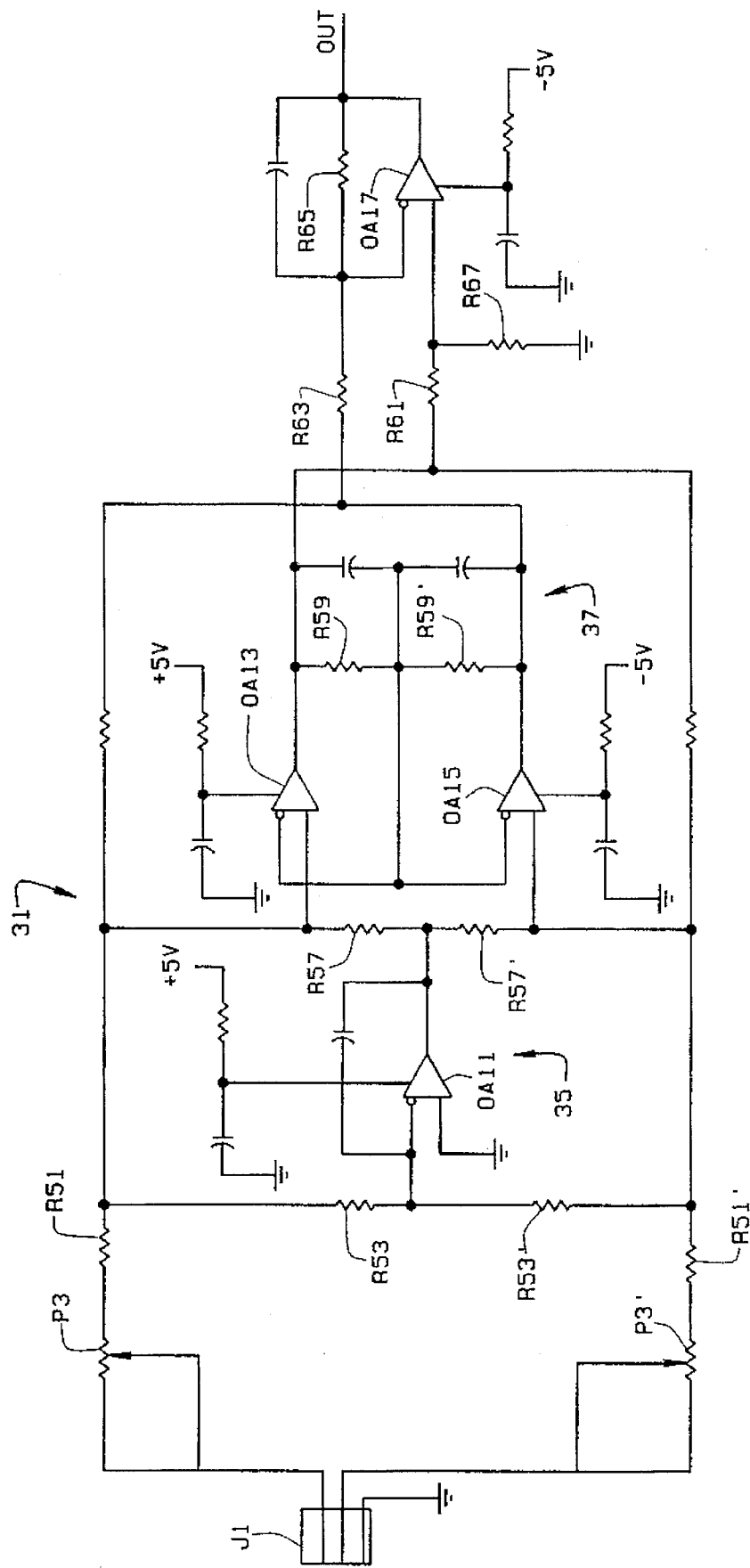
FIG. 2 is an electrical schematic of an audio interface circuit of the present invention.

Turning now to FIG. 2, a circuit 31, similar in some ways to circuit 11, is shown for interfacing any of a variety of audio input devices such as microphones, musical instruments, etc. to a sound recording device such as an Alesis sound recording system. In this particular circuit plug J1 is connected through a pair of ganged potentiometers P3, P3' to the rest of the circuit. Ganged potentiometers P3, P3' are preferably the same type as used in circuit 11, discussed above, but they are connected in the circuit somewhat differently. The input and wiper terminals of each of these potentiometers are connected together in a somewhat more conventional arrangement. Their output terminals are connected through respective 511Ω resistors R51, R51' to a first stage 35 consisting essentially of a pair of 20K resistors R53, R53' connected in series across the circuit and an op amp OA11. The inverting input of op amp OA11 is connected to the junction between resistors R53 and R53', while its output is supplied to a second stage 37 of circuit 31.

Second stage 37 includes a pair of op amps OA13, OA15 whose non-inverting inputs are connected through a pair of 5.11K resistors R57, R57' to the output of op amp OA11. Each op amp in the second stage has a 10K resistor R59, R59' connected between its output and its inverting input. The output of op amp OA13 is also connected through a 10K resistor R61 to the non-inverting input of an op amp OA17, while the output of op amp OA15 is supplied through a 10K resistor R63 to the inverting input of op amp OA17. Another 10K resistor R65 is connected between the output of op amp OA17 and its inverting input, while yet another 10K resistor R67 is connected between the non-inverting input of op amp OA17 and ground.

The output of op amp OA17 is the output of interface circuit 31. In the present example, it is connected to a suitable recording device such as the above-mentioned Alesis machine (not shown). By suitably adjusting ganged potentiometers P3, P3', the user may interface any of a variety of input equipment to the recording device without the need for an expensive console.

Figure 3:
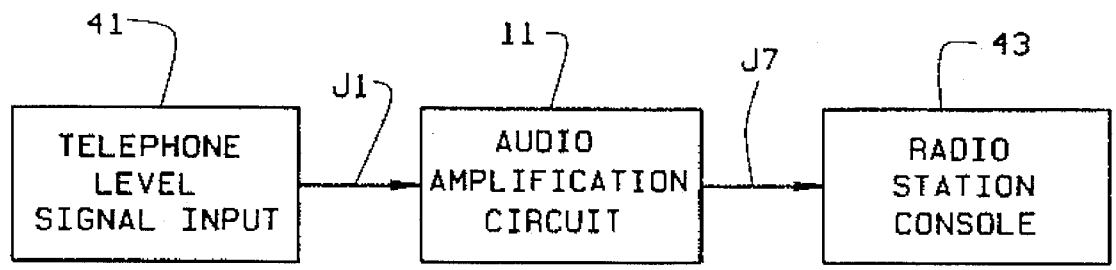
FIG. 3 is a block diagram of the circuit of FIG. 1 used in connection with a radio station console.

Turning to FIG. 3, circuit 11 is shown connected to a telephone level signal input signal input 41 by plug J1. As described above in connection with the prior art, matching a telephone signal level to a radio station console (which operates at a different level) would be desirable. Circuit 11 performs that matching, taking the telephone level input on plug J1 and supplying it at the proper level (via plug J7) to a radio station console 43. Radio station console 43 is, therefore, one of the pieces of equipment to which the output of circuit 11 can be connected.

Figure 4:
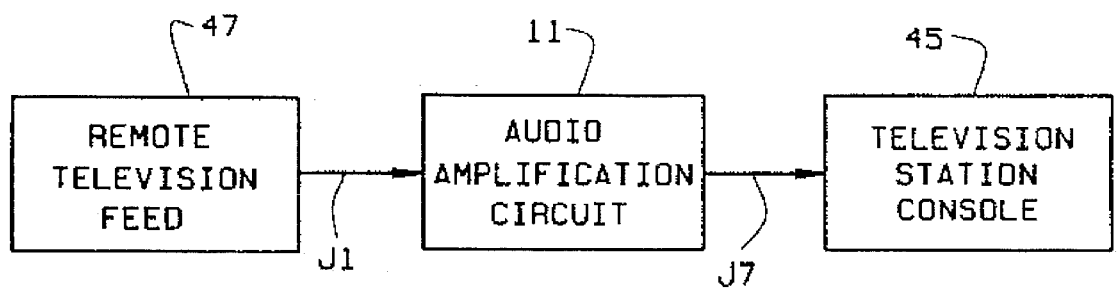
FIG. 4 is a block diagram of the circuit of FIG. 1 used in connection with a television station console.

Similarly, referring to FIG. 4, the output of circuit 11 is shown connected via plug J7 to a television station console 45. In this application, as touched on in the description of the prior art, the problem is converting the signal levels from a remote television feed 47 to the proper level for the console. Circuit 11 accomplishes this task in the manner described above.

In view of the above, it will be seen that all the objectives of the present invention are achieved and other advantageous results obtained. The examples of the present invention herein are illustrative only and are not to be taken in a limiting sense.

What is claimed is:

1. An audio amplification circuit comprising:

a ganged pair of logarithmic potentiometers, each potentiometer of the pair having an input terminal for connection to an audio input signal from an audio device, an output terminal, and a wiper terminal;

a preamplifier stage having an input connected to the wiper terminals of both logarithmic potentiometers, said preamplifier stage also having an output; and an amplification stage having a matched pair of operational amplifiers with each operational amplifier having an input connected to the output of the preamplifier stage, each operational amplifier having a feedback loop which includes the resistance of at least one of the logarithmic potentiometers between the output terminal and the wiper terminal of said logarithmic potentiometer, the outputs of the matched pair of operational amplifiers constituting the outputs of the amplification stage.

2. The audio amplification circuit as set forth in claim 1 wherein the audio device is a microphone, further including manually operable means for connecting said microphone to a source of direct current.

3. The audio amplification circuit as set forth in claim 2 wherein the manually operable means includes a pair of ganged switches connected to a dc voltage source.

4. The audio amplification circuit as set forth in claim 1 wherein the preamplifier stage includes an operational amplifier having an inverting input connected to the wiper terminals of both logarithmic potentiometers.

5. The audio amplification circuit as set forth in claim 1 wherein the amplification stage has a pair of outputs, said outputs being connected to a floating output stage having a second pair of matched operational amplifiers, one output of the amplification stage being connected to one of the operational amplifiers of the floating output stage and the other output of the amplification stage being connected to the other of the operational amplifiers of the floating output stage.

6. The audio amplification circuit as set forth in claim 1 wherein the audio amplification circuit consists essentially of non-inductive elements.

7. The audio amplification circuit as set forth in claim 1 wherein the audio amplification circuit includes solid state isolation circuitry.

8. The audio amplification circuit as set forth in claim 1 wherein the circuit includes means for simultaneous adjustment of input impedance and gain.

9. The audio amplification circuit as set forth in claim 1 wherein the ganged potentiometers include a manually operable control knob, the amplification circuit being configured such that the gain of the circuit in response of the circuit to movement of the control knob of the logarithmic potentiometers is essentially a linear function of knob movement.

10. The audio amplification circuit as set forth in claim 1 wherein the input impedance of the amplification circuit may be varied as desired from approximately 600 ohms to approximately 100K-ohms.

11. The audio amplification circuit as set forth in claim 10 wherein the audio input signal is a telephone signal.

12. An audio amplification circuit comprising:

a ganged pair of potentiometers, each potentiometer of the pair having an input terminal for connection to an audio input signal from an audio device, an output terminal, and a wiper terminal;

a preamplifier stage having an input connected to the wiper terminals of both potentiometers, said preamplifier stage also having an output; and an amplification stage having a matched pair of operational amplifiers with each operational amplifier having an input connected to the output of the preamplifier stage, each operational amplifier having a feedback loop which includes the resistance of at least one of the potentiometers between the output terminal and the wiper terminal of said potentiometer.

13. The audio amplification circuit as set forth in claim 12 wherein the audio device is a microphone, further including manually operable means for connecting said microphone to a source of direct current.

14. The audio amplification circuit as set forth in claim 12 wherein the preamplifier stage includes an operational amplifier having an inverting input connected to the wiper terminals of both potentiometers.

15. The audio amplification circuit as set forth in claim 12 wherein the amplification stage has a pair of outputs, said outputs being connected to a floating output stage having a second pair of matched operational amplifiers, one output of the amplification stage being connected to one of the operational amplifiers of the floating output stage and the other output of the amplification stage being connected to the other of the operational amplifiers of the floating output stage.

16. The audio amplification circuit as set forth in claim 12 wherein the circuit includes means for simultaneous adjustment of input impedance and gain.

17. The audio amplification circuit as set forth in claim 12 further including a plurality of output sockets connected in parallel to the outputs of the matched operational amplifiers.

18. An audio amplification circuit comprising:

a ganged pair of potentiometers, each potentiometer of the pair having an input terminal for connection to an audio input signal from an audio device, an output terminal, and a wiper terminal;

a preamplifier stage having an input connected to the wiper terminals of both potentiometers, said preamplifier stage also having an output; and an amplification stage having a first matched pair of operational amplifiers with each operational amplifier having an input connected to the output of the preamplifier stage, each operational amplifier also having an output;

a plurality of output sockets connected in parallel to the outputs of the matched operational amplifiers.

19. The audio amplification circuit as set forth in claim 18 wherein the preamplifier stage includes an operational amplifier connected to the wiper terminals of both potentiometers.

20. The audio amplification circuit as set forth in claim 18 wherein the amplification stage has a pair of outputs connected to a floating output stage having a second pair of matched operational amplifiers, one output of the amplification stage being connected to one of the operational amplifiers of the floating output stage and the other output of the amplification stage being connected to the other of the operational amplifiers of the floating output stage.

21. The audio amplification circuit as set forth in claim 20 further including a plurality of output sockets connected in parallel to the outputs of the first pair of matched operational amplifiers.

22. The audio amplification circuit as set forth in claim 18 wherein the circuit includes means for simultaneous adjustment of input impedance and gain.

23. An audio amplification circuit comprising:

a ganged pair of potentiometers, each potentiometer of the pair having an input terminal for connection to an audio input signal from an audio device, an output terminal, and a wiper terminal;

a preamplifier stage having an input connected to the wiper terminals of both potentiometers, said preamplifier stage also having an output; and an amplification stage having a first matched pair of operational amplifiers with each operational amplifier having an input connected to the output of the preamplifier stage, each operational amplifier also having an output;

a second pair of matched operational amplifiers, each having an input and a floating output, the input of each operational amplifier of the second pair being connected to the output of a corresponding operational amplifier of the first pair.

24. The audio amplification circuit as set forth in claim 23 further including a plurality of output sockets connected in parallel to the outputs of the first pair of matched operational amplifiers.

25. The audio amplification circuit as set forth in claim 23 wherein the circuit includes means for simultaneous adjustment of input impedance and gain.

26. The audio amplification circuit as set forth in claim 23 wherein the second pair of matched operational amplifiers constitute means for providing unity gain.

27. The audio amplification circuit as set forth in claim 23 wherein the audio input signal is a telephone signal, further including a radio station console, the outputs of the second set of operational amplifiers being connected to said radio station console, whereby the line level of the telephone signal is adjusted to the line level of the radio station console.

28. The audio amplification circuit as set forth in claim 23 further including a television station console, the outputs of the second set of operational amplifiers being connected to the television station console.

29. An audio interface circuit comprising:

a ganged pair of potentiometers for connection to an audio input signal from an audio device, and being configured to vary the input impedance of the audio interface circuit, said ganged pair of potentiometers having a control knob which is manually operable to adjust the gain of the audio interface circuit to match the level of the signal from the audio device to a predetermined signal level;

a preamplifier stage having an input connected to both potentiometers, said preamplifier stage also having an output; and an amplification stage having a matched pair of operational amplifiers with each operational amplifier having an input connected to the output of the preamplifier stage, each operational amplifier also having an output;

an output stage connected to both outputs of the amplification stage for providing an output signal at the predetermined level set by the potentiometers to a second audio device.

30. The audio interface circuit as set forth in claim 29 wherein the potentiometers are logarithmic potentiometers.

* * * * *